US 9,980,051 B2
May 22, 2018

(12) United States Patent
Clerici et al.

(54) MEMS LOUDSPEAKER HAVING AN ACTUATOR STRUCTURE AND A DIAPHRAGM SPACED APART THEREFROM (71) Applicant: USound GmbH, Graz (AT)

(72) Inventors: Andrea Rusconi Clerici, Hamburg (DE); Ferruccio Bottoni, Graz (AT)

(73) Assignee: USOUND GMBH, Graz (AT)

( * ) Notice: Subject to any disclaimer, the term of this patent is extended or adjusted under 35 U.S.C. 154(b) by 0 days. days.

(21) Appl. No.: 15/311,127

(22) PCT Filed: May 13, 2015

(86) PCT No.: PCT/EP2015/060659
§ 371 (c)(1),
(2) Date: Nov. 14, 2016

(87) PCT Pub. No.: WO2015/173334
PCT Pub. Date: Nov. 19, 2015

(65) Prior Publication Data
US 2017/0094418 A1    Mar. 30, 2017

(30) Foreign Application Priority Data
May 14, 2014 (DE) .................. 10 2014 106 753

(51) Int. Cl.
H04R 25/00    (2006.01)
H04R 17/00    (2006.01)
(Continued)

(52) U.S. Cl.
CPC ......... H04R 17/005 (2013.01); B81B 3/0037 (2013.01); H04R 7/18 (2013.01);
(Continued)

(58) Field of Classification Search
CPC ...... H04R 19/005; H04R 17/00; H04R 23/02; B81B 3/0021
(Continued)

(56) References Cited

U.S. PATENT DOCUMENTS 5,804,906 A     9/1998  Tsutsumi
2010/0219722 A1  9/2010  Onishi et al.
(Continued)

FOREIGN PATENT DOCUMENTS

DE    102011086722 A1    5/2013
JP    S577298 U          1/1982
WO    WO 03/098964 A2    11/2003

OTHER PUBLICATIONS

German Search Report, dated Oct. 10, 2014.
(Continued)

Primary Examiner — Sunita Joshi
(74) Attorney, Agent, or Firm — Dority & Manning, P.A.

(57) ABSTRACT

The invention relates to a MEMS loudspeaker (1) for generating sound waves in the audible wavelength spectrum, with a carrier substrate (2) that features a substrate cavity (6) with two substrate openings (7, 8), which are formed on two opposite sides of the carrier substrate (2), an actuator structure (3), in particular a piezoelectric actuator structure, which is arranged in the area of one of the two substrate openings (7, 8) and is connected to the carrier substrate (2) in its edge area, and a membrane (4) anchored in its edge area, which, by means of the actuator structure (3), can be set into vibration for generating sound waves. In accordance with the invention, in a cross-sectional view of the MEMS loudspeaker (1), the membrane (4) is spaced at a distance from the actuator structure (3), such that an intermediate cavity (13) is formed between these two. Furthermore, the MEMS loudspeaker (1) features a coupling element (13) arranged in the intermediate cavity (13), which connects the
(Continued)

actuator structure (3) to the membrane (4) and may vibrate with this with respect to the carrier substrate (2).

17 Claims, 4 Drawing Sheets

(51) Int. Cl.
*H04R 7/18* (2006.01)
*B81B 3/00* (2006.01)
*H01L 23/12* (2006.01)

(52) U.S. Cl.
CPC .................. *B81B 2201/0257* (2013.01); *B81B 2203/0127* (2013.01); *B81B 2203/0315* (2013.01); *H04R 2201/003* (2013.01)

(58) Field of Classification Search
USPC ......... 381/163, 173–175; 257/704, 723, 724, 257/731, 774, 782
See application file for complete search history.

(56) References Cited

U.S. PATENT DOCUMENTS

| | | |
|---|---|---|
| 2011/0075867 A1 | 3/2011 | Chung et al. |
| 2011/0085684 A1 | 4/2011 | Kim et al. |
| 2013/0126991 A1 | 5/2013 | Ehrenpfordt et al. |

OTHER PUBLICATIONS

EP International Search Report, dated Aug. 12, 2015.
International Preliminary Report on Patentability, dated Nov. 24, 2016.

MEMS LOUDSPEAKER HAVING AN ACTUATOR STRUCTURE AND A DIAPHRAGM SPACED APART THEREFROM

FIELD OF THE INVENTION

This invention relates to a MEMS loudspeaker with a carrier substrate and a membrane that can be set into vibration for generating sound waves in the audible wavelength spectrum.

BACKGROUND

The term "MEMS" stands for microelectromechanical systems. With MEMS loudspeakers, sound generation takes place by means of a swivel-mounted membrane. The membrane can be set into vibration for generating a sound wave by means of actuators (in particular, piezoelectric actuators). As a rule, such a micro-loudspeaker must generate a high displacement of air volume in order to be able to reach a significant sound pressure level. Such a micro-loudspeaker is known, for example, from DE 10 2012 220 819 A1.

Furthermore, a micro-loudspeaker, which comprises a piezoelectric actuator and a membrane, which are arranged on a substrate, which features a cavity, is also known from US 2011/0051985 A1. The piezoelectric actuator comprises a piezoelectric layer, which is connected to the membrane over the entire area through an interposed electrode layer. Thus, together with the membrane, the piezoelectric layer forms a multi-layer unit. This restricts the design freedom for the formation of the membrane by the actuators. The design freedom of the actuator is also restricted by the membrane. Thus, the membrane must have a certain size, in order to ensure sufficiently good acoustic performance. On the other hand, the actuators must be formed as small as possible, in order to keep the cost of the MEMS loudspeaker low. However, with the MEMS loudspeakers known from the state of the art, an optimized configuration of one of these two components always adversely affects the other component.

Thus, it is the task of this invention to provide a MEMS loudspeaker that can be manufactured cost-effectively and features an improved acoustic performance.

SUMMARY OF THE INVENTION

The task is achieved by a MEMS loudspeaker with the characteristics described below.

A MEMS loudspeaker for generating sound waves in the audible wavelength spectrum is proposed. The MEMS loudspeaker features a carrier substrate that is preferably formed from silicon. The carrier substrate features a substrate cavity with two substrate openings. The two substrate openings are formed on two opposite sides, in particular front surfaces, of the carrier substrate. Thus, the carrier substrate is preferably formed as a circumferentially closed carrier frame. Furthermore, the MEMS loudspeaker comprises an actuator structure, in particular a piezoelectric actuator structure. The actuator structure is preferably formed with multiple layers, whereas this comprises at least one actuator layer (in particular, a piezoelectric actuator layer), an electrode layer and/or a carrier layer. The actuator layer and/or the electrode layer is preferably omitted in some areas. The actuator structure is arranged in the area of one of the two substrate openings. In its edge area, the actuator structure is connected to the carrier substrate, in particular at one of the front surfaces of the carrier substrate. Preferably, the actuator structure, in particular its carrier layer, traverses the one substrate opening over the entire area. In this case, the one substrate opening is preferably completely closed by means of the actuator structure. In addition, the MEMS speaker includes a membrane. The membrane is preferably formed from an elastomer, in particular silicone. The membrane is anchored in its edge area, in particular the entire edge area. By means of the actuator structure, the membrane can be set into vibration for generating sound waves, such that it is able to vibrate with respect to its anchoring edge area.

In a cross-sectional view of the MEMS loudspeaker, the membrane is spaced at a distance from the actuator structure. Thus, an intermediate cavity is formed between these two. The membrane and the actuator structure are thus spatially decoupled from each other. Furthermore, the MEMS loudspeaker features a coupling element. The coupling element is arranged in the intermediate cavity. Furthermore, the coupling element connects the actuator structure to the membrane, in particular in some areas. Thus, the membrane and the actuator structure are mechanically coupled with each other by means of the coupling element. Upon the electrical excitation of the actuator structure, together with the membrane and the actuator structure, the coupling element consequently vibrates with respect to the carrier substrate. Advantageously, the membrane and the actuator structure can be optimized essentially independently of each other, in particular geometrically with respect to their respective size, without adversely affecting the properties of the other component. Accordingly, for example, the actuator structure can be formed to be smaller in comparison to the membrane, by which the material costs of the MEMS loudspeaker can be reduced. At the same time, the membrane can be formed as large as possible, in particular larger than the actuator structure, by which the performance—that is, the acoustic performance—of the MEMS loudspeaker can in turn be increased.

Despite this spatial distancing or spatial decoupling of the membrane from the actuator structure, they are nevertheless coupled with each other by means of the coupling element, in particular in at least one area, such that the membrane can be controlled by means of the actuator structure. Advantageously, at the same time, with a design geared to optimal performance, the MEMS loudspeaker nevertheless can be formed with a high degree of cost-effectiveness.

It is advantageous if the membrane (in particular, together with the actuator structure and the coupling element) can be deflected out of neutral position (in particular, a horizontal neutral position) when the actuator structure is active. In this neutral position, the membrane and/or the actuator structure are essentially horizontally oriented and/or unbent. Preferably, the membrane can be deflected with an elongation of more than 200%. Based on the high degree of elongation, advantageously, a very high sound pressure can be generated.

In order to improve the acoustic performance of the MEMS loudspeaker and in order to protect it from damage in the event of a shock, it is advantageous if the actuator structure is formed (in particular, in a stiff form) in such a manner that, when the actuator structure is inactive, the membrane, after its deflection, can be led back into the neutral position by means of the actuator structure and/or is stable in the neutral position. Thus, the actuator structure assumes the functions of a spider, as this is known from customary large loudspeakers. Thus, in its inactive state, the actuator structure also acts—in addition to its ability to activate the membrane—as a damper, in order to keep the membrane largely in its neutral position in the case of impacts. Furthermore, after its deflection, the actuator structure returns the membrane back into its neutral position, such that, upon a renewed activation, the performance of the MEMS loudspeaker is not influenced.

In order to be able to generate the highest possible sound pressure, the membrane must be able to expand or swing as far as possible. Based on this, it is advantageous if the membrane has a thickness of less than 0.3 mm and/or an elastic modulus of less than 100 MPa.

In order to avoid the tearing of the membrane, it is advantageous if the membrane features at least one thickened reinforcing area. In addition or alternatively, for the same reason, it is advantageous if the membrane at least comprises a reinforcing element, which is preferably arranged on its side turned away from the coupling element. The reinforcing element is preferably formed from a metal or a metal alloy—in particular, aluminum and/or aluminum nitride—silicon, plastic and/or a composite material—in particular, with carbon fibers. The reinforcing element prevents the tearing of the highly flexible membrane.

In order to improve the flexibility and ability to deflect the membrane, it is advantageous if this features an area with projections (in particular, wave-shaped projections). This area is preferably arranged adjacent to its fastening area.

It is advantageous if the actuator structure and the membrane are aligned parallel to each other in the neutral position. Furthermore, it is advantageous if the maximum height of the coupling element corresponds to the spacing (in particular, the shortest spacing) between the actuator structure and the membrane in the neutral position. As a result, the membrane and the actuator structure can be coupled with each other without their neutral position (in particular, their horizontal and/or mutually parallel neutral position) being influenced by means of the coupling element.

It is also advantageous if the membrane is arranged in the area of the other substrate opening (that is, in particular at the front surface of the carrier substrate opposite to the actuator structure), traverses such substrate opening and/or is connected to the carrier substrate in its edge area. The membrane is preferably connected, in its edge area, to a surface turned away from the actuator structure, in particular the front surface, of the carrier substrate. At this, the membrane can be adhered to the carrier substrate. Advantageously, the membrane is thus anchored directly on the carrier substrate. Thus, the substrate carrier, the actuator structure, the membrane and the coupling element form a structural unit with a suspended membrane, which can be flexibly connected, for example, in or to different circuit boards.

It is advantageous if the MEMS loudspeaker includes a circuit board, in particular a PCB (printed circuit board). The circuit board also preferably features a first circuit board cavity, in which the carrier substrate, the actuator structure and/or the membrane are arranged in such a manner that the actuator structure and the membrane are able to vibrate with respect to the circuit board. By means of an actuator structure and/or membrane embedded in this way, the MEMS loudspeaker can be formed in a highly compact manner, since the thickness of the circuit board can be used for arranging at least one of the above-mentioned components and for forming a cavity.

In an advantageous additional form of the invention, the first circuit board cavity features a first area, in particular a cavity area, which at least partially forms the cavity of the MEMS loudspeaker. In addition or alternatively, the first circuit board cavity features a second area, in particular a substrate receiving area, which is adjacent to the first area, in which the carrier substrate is arranged. Preferably, the first circuit board cavity is wider in its second area than in its first area. Thereby, the first circuit board cavity features a pedestal or a step formed between the first and second areas. Thus, advantageously, the carrier substrate is held at least in one direction in the circuit board in a positive-locking manner. Furthermore, the exact position of the carrier substrate in the circuit board can thereby be established. In addition, the carrier substrate can be glued to the circuit board, in particular in the step area. In addition or alternatively, it is also conceivable for the circuit board to be constructed in layers in such a manner that the first circuit board cavity features an undercut, such that the carrier substrate is also held in a second direction in a positive-locking manner. Thus, the carrier substrate is encompassed by the circuit board, in particular in its edge area, in a positive-locking manner.

It is advantageous if the membrane is spaced at a distance from the carrier substrate in a cross-sectional view of the MEMS loudspeaker. As a result, the geometrical configuration of the membrane, in particular its surface spread, is not limited to the geometric dimensions of the carrier substrate. Given the fact that the membrane is decoupled from the carrier substrate, the carrier substrate can advantageously be formed to be smaller than the membrane. In this way, material, in particular silicon, of the carrier substrate can be saved, by which the MEMS loudspeaker can be manufactured more favorably. At the same time, the membrane can be formed to be very large, by which the acoustic performance of the MEMS—loudspeaker can be increased.

In this regard, it is also advantageous if the membrane is connected in its edge area to the circuit board, in particular at a front surface of the circuit board or at a side wall of the first circuit board cavity. If the membrane is fastened (in particular, glued) to the front surface of the circuit board, the membrane preferably extends, in particular over the entire area, by means of a sound outlet opening of the first circuit board cavity. Alternatively, if the membrane is fastened to a side wall of the first circuit board cavity—that is, in the interior of the first circuit board cavity—it extends, in particular over the entire area, at least over the entire width of the first circuit board cavity in its corresponding area. In this case, the edge area of the membrane is preferably laminated in the circuit board, which is constructed in layers, and/or is glued to it.

It is also advantageous if the first circuit board cavity features a third area, in particular a membrane spacing area and/or a membrane fastening area, which in particular is adjacent to the second area, by means of which the membrane is spaced at a distance from the carrier substrate and/or in which the membrane is anchored in the circuit board. As a result, the membrane can be arranged in a manner spaced at a distance from the carrier substrate in the circuit board. Preferably, the membrane is arranged, in particular, in the area of the end of the third area turned away from the second area, such that the distance between the membrane and the carrier substrate is as large as possible. For the enlargement of the membrane area, it is also advantageous if the first circuit board cavity is formed to be wider in its third area than in its second area. As a result, for saving material, the carrier substrate can be formed as small as possible, and, for increasing the acoustic performance of the MEMS loudspeaker, the membrane can be formed as large as possible.

The third area may feature a constant width. Alternatively, however, its width can also increase from its end adjacent to the second area, in the direction of the sound outlet opening.

It is advantageous if the first circuit board cavity features a fourth area (which is, in particular, adjacent to the third area), in particular a sound-conducting channel area, the width of which preferably increases (in particular, in a conical manner) from the third area in the direction of the sound outlet opening. This can increase the sound pressure of the MEMS loudspeaker.

Furthermore, it is advantageous if the membrane is spaced through the fourth area from the outer surface of the circuit board and/or from the sound outlet opening. Thus, the membrane is protected in the interior of the circuit board.

In order to improve the acoustic performance of the MEMS loudspeaker and, at the same time, to manufacture it as cost-effectively as possible, it is advantageous if, in a cross-sectional view of the MEMS loudspeaker, the membrane is formed to be wider in comparison to the actuator structure and/or to the carrier substrate.

It is also advantageous if the intermediate cavity is formed by the substrate cavity and/or at least partially by the second and/or third area of the first circuit board cavity. Accordingly, it is advantageous if the carrier substrate, with the actuator structure, is arranged in the circuit board in such a manner that the actuator structure is arranged adjacent to the cavity. In this case, the intermediate cavity is formed both by the substrate cavity and by the second and/or third area of the first circuit board cavity. Alternatively, however, the carrier substrate, with the actuator structure, may also be arranged in the mounting position, rotated by 180°, in the circuit board. In this case, the outer surface of the actuator structure is pointed in the direction of the third area of the first circuit board cavity, such that the intermediate cavity is not additionally formed by the substrate cavity. Thus, the intermediate cavity is formed exclusively by the second and/or third area of the first circuit board cavity. With this mounting position, the size of the cavity can advantageously be increased by the substrate cavity.

It is advantageous if the coupling element is formed in one piece, in particular from silicon. As a result, the coupling element can be advantageously formed very quickly and inexpensively from a substrate blank, together with the carrier substrate. At this, the substrate cavity is introduced (in particular, etched) into the substrate blank, by which simultaneously, both the coupling element along with the carrier substrate or the carrier frame, as the case may be, are at least partially formed.

Alternatively, however, it is also advantageous if the coupling element is formed in several parts. In this case, it is particularly advantageous if the coupling element comprises at least a first part, in particular made of silicon, which is connected to the actuator structure, and a second part connected to the membrane. The two parts are firmly connected (in particular, glued) to each other. The second part may be formed from the same material as the first part. In this regard, it is particularly advantageous if the second part is formed from silicon. Alternatively, however, the second part can also be formed from a different material compared to the first part, in particular ceramic, a metal, preferably aluminum, a metal alloy, in particular aluminum nitride, a plastic and/or a composite material, in particular carbon fibers. Furthermore, it is advantageous if the first part does not feature any undercuts. A function-dependent geometric configuration of the coupling element, for example with an undercut—such that the coupling element features, at its end turned towards the membrane, a contact surface with the membrane that is as large as possible—can be assigned to the coupling element, in particular by means of the second part. At this, it is advantageous if the second part is formed to be wider than the first part, such that the coupling element features an under cutter. Alternatively, however, the second part can also have an undercut, whereas this is preferably formed with a T-shape.

Since the membrane is formed to be highly elastic, in order to avoid damages to the membrane by the coupling element, it is advantageous if the coupling element is coupled with the membrane with as large of space as possible. In this connection, it is thus advantageous if the coupling element is connected to the actuator structure in a first connecting area and to the membrane in a second connecting area opposite to the first connecting area, whereas, preferably, the second connecting area is formed in a manner larger, in particular wider in a cross-sectional view of the MEMS loudspeaker, or equal to the first connecting area. Thereby, the force introduced by the actuator for activating the membrane can be transferred through the coupling element over a large area of the membrane.

For the reasons mentioned above, it is also advantageous if, at its end turned towards the membrane, in particular the second part, the coupling element is formed in a manner wider than at its end turned towards the actuator structure, in particular than the first part. Preferably, the coupling element has a T-shape. For forming this geometrical shape, the second part can, in particular, be formed wider than the first part. For reasons of manufacturing technology, it is also advantageous if the second part is formed with a T-shape and/or the first part is essentially square and/or rectangular in the cross-section.

Furthermore, it is advantageous if the coupling element is fastened to a side of the actuator structure turned towards the substrate cavity. At this, the connection between the coupling element and the actuator structure can already be formed during the production process of the carrier substrate, whereas the actuator structure is preferably applied to the substrate blank and the substrate cavity is subsequently etched, by which the coupling element connected to the actuator structure arises. Alternatively, it is also advantageous if the coupling element is fastened to a side of the actuator structure turned away from the substrate cavity. In this case, the coupling element is not produced simultaneously during the manufacturing process of the carrier substrate and the actuator structure, but is subsequently applied and/or fastened on the outer side of the actuator structure. Depending on the arrangement of the coupling element relative to the actuator structure, the installation orientation of the carrier substrate can be varied with the actuator structure. In principle, however, it is provided that the coupling element always extends outwards from the actuator structure in the direction of the sound outlet opening of the circuit board.

It is advantageous if, in a cross-sectional view of the MEMS loudspeaker, the coupling element is formed higher in comparison to the carrier substrate. Thereby, with an alignment parallel to the actuator structure, the membrane can be arranged in a manner spaced at a distance from the carrier substrate. As a result, the design freedom upon the formation of the membrane is not limited to the geometric dimensions of the carrier substrate. Thus, in comparison to the actuator structure and/or to the carrier substrate, the membrane can be formed in a manner wider or larger in cross-section.

In an advantageous additional form of the invention, the carrier substrate and, at least partially, the coupling element, in particular the first part thereof, are produced from the same material, in particular from silicon, and/or from the same substrate blank. In addition or alternatively, it is also advantageous if the carrier substrate is omitted and/or reduced in thickness on its side turned away from the actuator structure, such that the coupling element features a greater height. As explained above, a decoupling between the membrane and the carrier substrate can thereby be effected, such that the membrane can be particularly formed to be larger in comparison to the carrier substrate.

The MEMS loudspeaker can be formed to be highly compact if the circuit board features a second circuit board cavity, in particular separate from the first circuit, in which an ASIC for driving the actuator structure is arranged, whereas the ASIC is thereby preferably completely integrated in the circuit board.

For the formation of the first and/or second circuit board cavity and/or for the positive-locking fastening of the carrier substrate and/or the membrane, it is advantageous if the circuit board is formed from several layers which are firmly connected (in particular, glued) to each other,

BRIEF DESCRIPTION OF THE DRAWINGS

Further advantages of the invention are described in the following embodiments. The following is shown.

DETAILED DESCRIPTION

Figure 1:
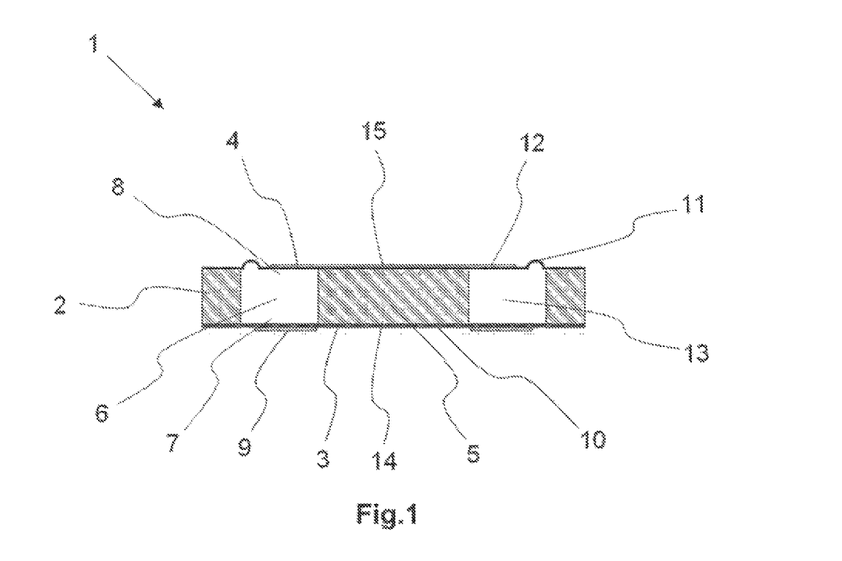
FIG. 1 a schematic cross-sectional view of a MEMS loudspeaker with a membrane fastened to a carrier substrate, which is connected to an actuator structure by means of a coupling element, FIG. 2 a schematic cross-sectional view of the MEMS loudspeaker according to the embodiment shown in FIG. 1, which is integrated into a circuit board, FIG. 3 a schematic cross-sectional view of the MEMS loudspeaker according to a second embodiment, whereas the membrane is anchored in the circuit board in a manner spaced at a distance from the carrier substrate and is connected to the actuator layer by means of the coupling element, FIG. 4 a schematic sectional view of the MEMS loudspeaker with a membrane suspended in the circuit board, whereas the coupling element connecting the membrane to an actuator structure is formed in two parts, FIG. 5 a schematic sectional view of an additional embodiment of the MEMS loudspeaker, whereas the part of the coupling element connected to the membrane is formed with a T-shape, FIG. 6 a schematic sectional view of the MEMS loudspeaker according to an additional embodiment, whereas the unit of the carrier substrate and the actuator structure is installed in the circuit board rotated by 180° in comparison to the preceding embodiment, and the coupling element is fastened to the outer side of the actuator structure, and FIG. 7 a schematic sectional view of an additional embodiment of the MEMS loudspeaker, wherein the membrane is fastened to the outer side, in particular a front surface, of the circuit board.

FIG. 1 shows a cross-sectional view of a first embodiment of a MEMS loudspeaker 1. The MEMS loudspeaker 1 features a carrier substrate 2, an actuator structure 3, a membrane 4 and a coupling element 5. According to the present embodiment, the carrier substrate 2 and the coupling element 5 are produced together from a substrate blank. The carrier substrate 2 features a substrate cavity 6. The substrate cavity 6 is open on two opposite sides, such that the carrier substrate 2 forms a support frame. Accordingly, the carrier substrate 2 defines a first substrate opening 7 through the front surface of one of the opposite sides of the carrier substrate 2 and a second substrate opening 8 through the front surface on the other one of the two opposite sides of the carrier substrate 2. The actuator structure 3 is arranged in the area of the first substrate opening 7.

The actuator structure 3 is preferably formed as a piezoelectric actuator structure 3 and comprises at least one actuator layer 9 (in particular, a piezoelectric actuator layer). Furthermore, the sandwich-like actuator structure 3 comprises a support layer 10 and at least one electrode layer, which is not shown in more detail here. The actuator structure 3 traverses the first substrate opening 7 of the substrate cavity 6 and is connected in its edge area to the carrier substrate 2, whereas, according to the present embodiment, the actuator structure 3 is preferably arranged on a front surface of the carrier substrate 2.

According to the embodiment shown in FIG. 1, the membrane 4 is suspended on the carrier substrate 2 in a swinging manner. In its edge area, the membrane 4 is fastened to a front surface of the carrier substrate 2 opposite to the actuator structure 3. Preferably, the membrane 4 is glued to the carrier substrate 2 in this area of the front surface. The membrane 4 is formed to be highly flexible. It preferably has a thickness of less than 0.3 mm. Furthermore, it features an elastic modulus of less than 100 MPa. Adjacent to its fastening area, the membrane 4 also features at least one projection 11. By means of this projection 11, the elongation of the membrane 4 can be increased. Given the fact that the membrane 4 is highly flexible, it can easily be damaged in the event of an overload. Based on this, the membrane 4 according to the embodiment shown in FIG. 1 comprises a reinforcing element 12. The reinforcing element 12 is fastened (in particular, glued) on the outer side of the membrane 4, that is, on the side of the membrane 4 turned away from the substrate cavity 6. The reinforcing element preferably is composed of a metal, ceramic, silicon, plastic and/or of a composite material, in particular of carbon. The reinforcing element 12 may also preferably be composed of aluminum or aluminum nitride. However, as an alternative or in addition to the reinforcing element 12, the membrane may also feature reinforcing areas (not shown here), in which the membrane 4 features a greater thickness, in particular more than 0.3 mm.

Based on the arrangement of the membrane 4 and the actuator structure 3 opposite to the carrier substrate 2, they are spaced at a distance from each other through the carrier substrate 2 arranged in between them. Thus, according to the cross-sectional view of the MEMS loudspeaker 1 shown in FIG. 1, an intermediate cavity 13 is formed between the membrane 4 and the actuator structure 3. According to the embodiment shown in FIG. 1, this intermediate cavity 13 is completely formed by the substrate cavity 6. The coupling element 5 is arranged in this intermediate cavity 13. In a first connecting area 14, the coupling element 5 is connected to the actuator structure 3, in particular on its inner side. Furthermore, the coupling element 5 features a second connecting area 15, in which the coupling element 5 is connected to the membrane 4. Based on the arrangement of the actuator structure 3 and the membrane 4 on the front surface of the carrier substrate 2, the coupling element 5 is fastened to the membrane 4 on the side of the membrane 4 turned towards the carrier substrate 2, in particular on the inner side, of the membrane 4. The coupling element 5 is preferably glued to the membrane 4 in the second connecting area 15. Thus, the membrane 4 is coupled with the actuator structure 3 through the coupling element 5 in such a manner that, upon an electrical excitation of the actuator layer 9, the membrane is able to vibrate, together with the coupling element 5 and the actuator structure 3, with respect to the carrier substrate 2.

In the figures, the MEMS loudspeaker 1 is shown in its inactive state. In this state, the membrane 4, the coupling element 5 and/or the actuator structure 3 are located in a neutral position, from which they can be deflected upon excitation by the actuator structure 3. The membrane 4 preferably can be deflected with an elongation of more than 200%. The actuator structure 3 and the membrane 4 are oriented parallel to each other in the neutral position. Accordingly, the maximum height of the coupling element 5 corresponds to the shortest distance between the actuator structure 3 and the membrane 4. According to the embodiment shown in FIG. 1, the coupling element 5 is formed with the same height as the carrier substrate 2.

The actuator structure 3 acts as a spider of a large loudspeaker, as is generally known. Accordingly, the actuator structure 3 is formed in such a manner that it holds the membrane 4 in its neutral position with a predetermined force, such that the membrane 4 is protected from damage by impacts acting externally. Furthermore, the acoustic quality of the MEMS loudspeaker 1 is improved through a corresponding holding of the membrane 4 in its neutral position. Thus, the actuator structure 3 is also formed in such a manner that, after its deflection, when the actuator structure is inactive (in particular, not supplied with current), the membrane 4 is led back into the neutral position by means of this.

Figure 2:
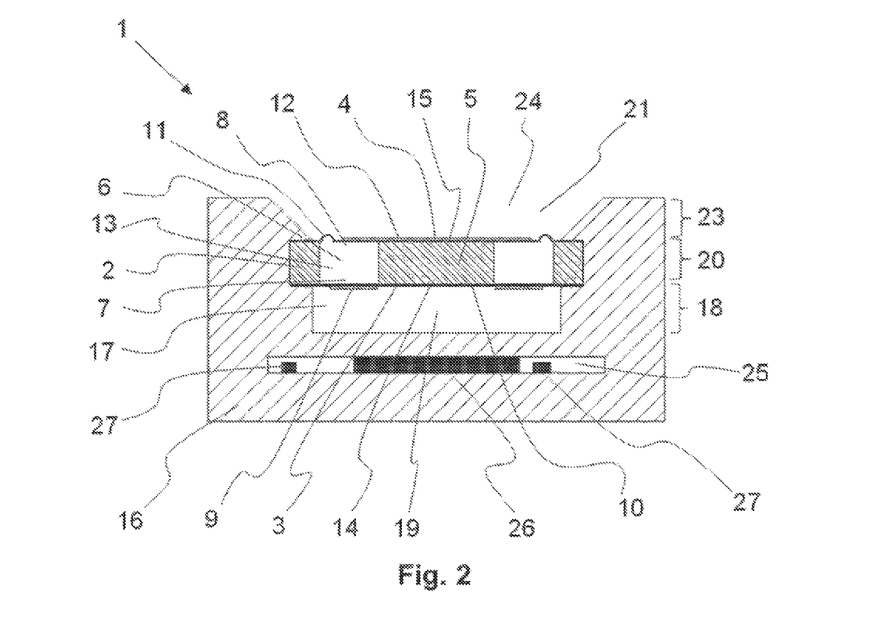

FIG. 2 shows a MEMS loudspeaker 1, which includes a circuit board 16, into which the unit known from FIG. 1 is embedded. For this purpose, the circuit board 16 features a first circuit board cavity 17. The first circuit board cavity 17 includes a multiple number of hollow regions, each with its own defined boundaries. According to the embodiment shown in FIG. 2, the first circuit board cavity 17 comprises a first hollow region 18, which forms a cavity 19 of the MEMS loudspeaker 1. Furthermore, the first circuit board cavity 17 comprises a second hollow region 20. In this second hollow region 20, the carrier substrate 2 is held in the circuit board 16 in a positive-locking manner. For this purpose, the second hollow region 20 features a greater width in comparison to the first hollow region 18, such that a step is formed between these two hollow region. The carrier substrate 2, with its front surface turned towards the cavity 19, abuts this step, such that the substrate carrier 2 is held in the circuit board 16 in a positive-locking manner. The second hollow region 20 is arranged immediately adjacent to the first hollow region 18.

Moreover, the first circuit board cavity 17 comprises a sound-conducting channel 21, which, according to the embodiment shown in FIG. 2, is formed by an additional hollow region 23 of the first circuit board cavity 17. The sound-conducting channel 21 or the hollow region 23, as the case may be, is arranged directly adjacent to the carrier substrate 2 or to the second hollow region 20 of the first circuit board cavity 17, as the case may be.

The circuit board 16 features a sound outlet opening 24. According to the embodiment shown in FIG. 2, the sound outlet opening 24 is formed at the end of the sound-conducting channel 21 turned away from the membrane 4. In the present case, the sound-conducting channel 21 is shaped in a conical manner in the sectional schematic view shown in FIG. 2.

The circuit board 16 also features a second circuit board cavity 25. This is spaced at a distance from the first circuit board cavity 17 and/or is formed under it. At least one electronic component, in particular an ASIC 26, is arranged in the second circuit board cavity 25. Furthermore, at least one passive electronic component 27 can also be arranged in the second circuit board cavity 25. In order to form the first and/or second circuit board cavity 17, 25, the circuit board 16 is constructed in layers, whereas at least some of these layers feature recesses for the formation of the respective circuit board cavity 17, 25.

In the following figures, additional embodiments of the MEMS loudspeaker are shown, whereas, essentially, only the differences with respect to the embodiments described above are discussed. Thus, with the following description, the additional embodiments for the same characteristics use the same reference signs. To the extent that these are not explained once again in detail, their design and mode of action correspond to the characteristics described above. The differences described below can be combined with the characteristics of the respective preceding and subsequent embodiments.

Figure 3:
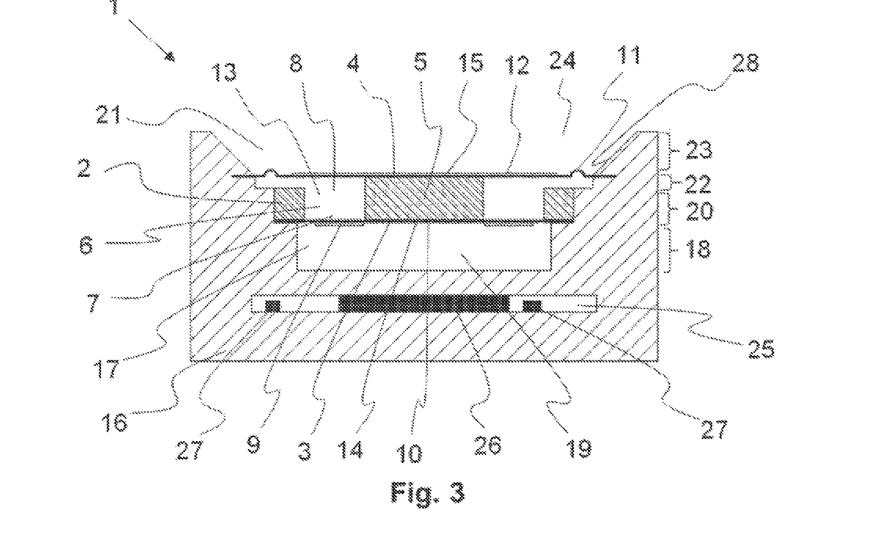

In contrast to the embodiment shown in FIGS. 1 and 2, in the embodiment shown in FIG. 3, the membrane 4 is spatially decoupled from the carrier substrate 2. Accordingly, a gap exists between the membrane 4 the front surface of the carrier substrate 2 at the second substrate opening 8 as shown schematically in the cross-sectional view shown in FIG. 3. In contrast to the previous embodiments, the membrane 4 is not fastened to the carrier substrate 2, rather, it is fastened to the circuit board 16. Thus, the membrane 4 is arranged in the interior of the first circuit board cavity 17, and, in its edge area, is fastened to a side wall 28 of the first circuit board cavity 17. According to FIG. 3, the MEMS loudspeaker 1 features a third hollow region 22 for spacing the membrane 4 from the carrier substrate 2. The third hollow region 22 (order of the membrane 4 spaced at a distance from the carrier substrate 2) is arranged adjacent to the second hollow region 20 (for the positive-locking receiving of the carrier substrate 2). The third hollow region 22 is formed to be wider in comparison to the second hollow region 20. As a result, the membrane 4 features a greater width in comparison to the carrier substrate 2 and/or the actuator structure 3.

The membrane 4 extends into the circuit board 16 over the entire width of the first circuit board cavity 17. Thus, it is fastened in this in a swinging manner. According to FIG. 3, the membrane 4 is arranged on the end of the third hollow region 22 turned away from the carrier substrate 2.

In the direction of the sound outlet opening 24, the fourth hollow region 23 adjoins the third hollow region 22 in order to form the sound-conducting channel 21. In the presently shown cross-sectional view of the MEMS loudspeaker 1, the membrane 4 is formed to be wider than the carrier substrate 2 and the actuator structure 3. Due to the spacing of the membrane 4 from the carrier substrate 2, in the present embodiment, unlike the previous embodiments, the intermediate cavity 13 is now not solely formed by the substrate cavity 6, but is also formed by the third hollow region 22 of the first circuit board cavity 17.

According to FIG. 3, the coupling element 5 features a greater height in comparison to the carrier substrate 2. The coupling element 5 extends from the inner side of the actuator structure 3, starting in the direction of the membrane 4, through the second and third hollow regions 20, 22 of the first circuit board cavity 17. The carrier substrate 2 and the coupling element 5, as in the case of the previous embodiments, are produced from the same material, in particular from silicon, whereas the substrate cavity 6 has been introduced into a substrate blank. However, in contrast to the previous embodiments, the height of the substrate blank has been reduced in the area of the carrier substrate 2, in particular in the circumference of the third hollow region 22, such that the coupling element 5 features a greater height in comparison to the carrier substrate 2.

Figure 4:
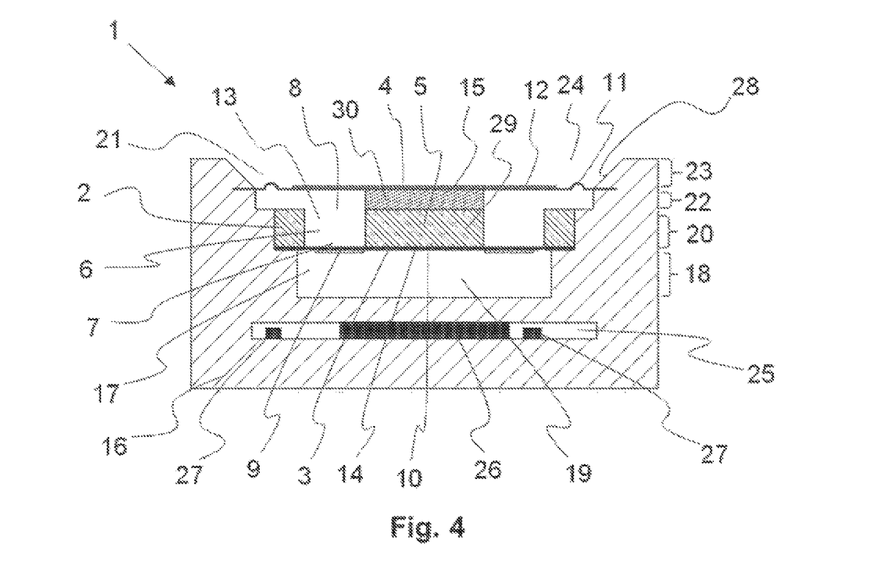

FIG. 4 shows an additional embodiment of the MEMS loudspeaker 1, whereas, in the present case, as a substantial difference in comparison to the previous embodiments, the coupling element 5 is not formed in one piece, but rather in several parts. Accordingly, the coupling element 5 comprises a first part 29 and a second part 30. The two parts 29, 30 are firmly connected to each other. The first part 29 is fastened on the inner side, that is, on the side of the actuator structure 3 turned towards the substrate cavity 6. The second part 30 is connected to the membrane 4 on a side of the membrane 4 turned towards the actuator structure 3.

The two parts 29, 30 can consist of different materials or of the same material. Preferably, the first part 29 is composed of the same material as the carrier substrate 2. The second part 30 preferably is composed of a material compared to the other, in particular ceramic, metal, plastic and/or a composite material. Furthermore, however, the second part can also be composed of aluminum, aluminum nitride and/or silicon.

Figure 5:
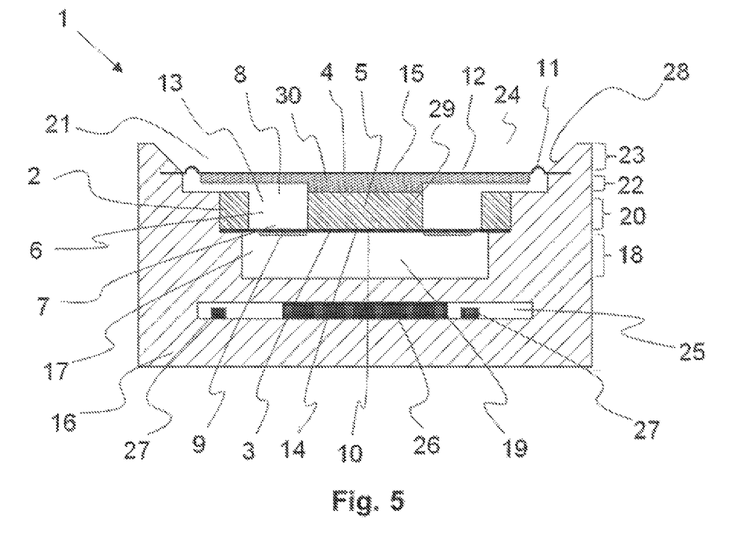

In the present case, the coupling element 5 is rectangular in the cross-section. Accordingly, the first and second parts 29, 30 have the same width relative to each other. Alternatively, the coupling element 5 can be formed with a T-shape according to the embodiment shown in FIG. 5 or FIG. 7. As a result, the first connecting area 14 of the coupling element 5 with the actuator structure 3 is more narrow in comparison to the second connecting area 15 with the membrane 4. Thus, the coupling element 5 features a larger connecting surface with the membrane 4 than with the actuator structure 3. According to FIGS. 5 and 7, the first part 29 of the coupling element 5 can be formed to be rectangular. In contrast to this, the second part 30 of the coupling element 5 either is formed in a T-shape according to FIG. 5 or, according to FIG. 7, features a greater width in comparison to the first part 29.

Figure 6:
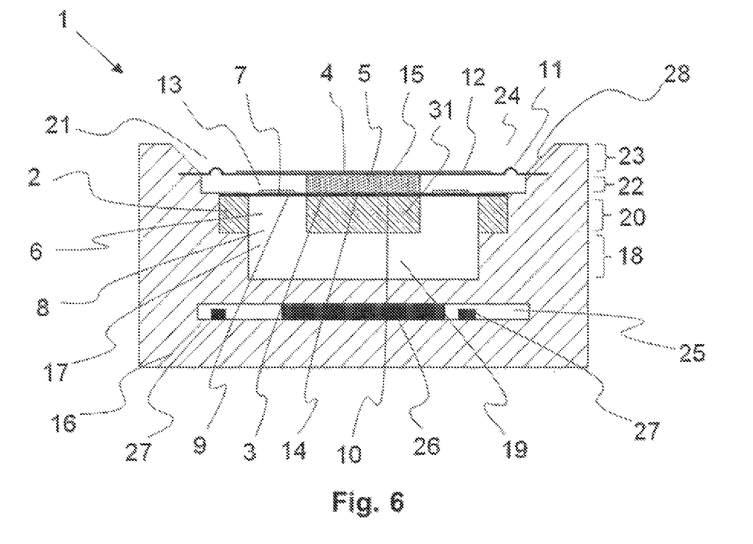

According to the embodiment shown in FIG. 6, the unit consisting of the carrier substrate 2 and the actuator structure 3 can also be integrated into the circuit board 16, as distinguished from the previous embodiments, rotated by 180°. In this case, the coupling element 5 is fastened on an outer side, that is, on a side of the actuator structure 3 turned away from the substrate cavity 6. Thus, the intermediate cavity 13 is formed exclusively by the third hollow region 22 of the first circuit board cavity 17. Furthermore, in the present case, the coupling element 5 is formed in one piece. Thus, according to the present embodiment, the actuator structure 3 additionally comprises a stiffening element 31. This is stiffening element 31 formed on the side of the actuator structure 3 turned away from the coupling element 5.

Figure 7:
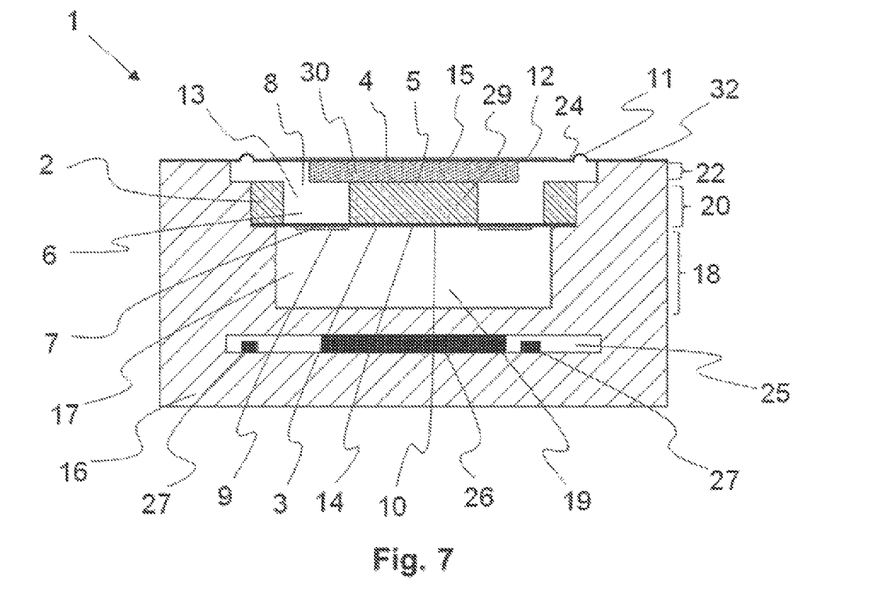

FIG. 7 shows an embodiment of the MEMS loudspeaker 1, with which the membrane 4 is not fastened in the interior of the circuit board 16, but is fastened at an outer side, in particular at a front surface 32 of the circuit board 16. Accordingly, the membrane 4 traverses the sound outlet opening 24 of the circuit board 16. Furthermore, FIG. 7 shows an additional alternative embodiment of the coupling element 5, whereas the coupling element 5 features a second connecting area 15 that is larger in comparison to the first connecting area 14. The coupling element 5 has a T-shape, whereas the second part 30 features a greater width in comparison to the first part 29, This invention is not limited to the illustrated and described embodiments. Variations within the scope of the claims, just as the combination of characteristics, are possible, even if they are illustrated and described in different embodiments.

LIST OF REFERENCE SIGNS

1 MEMS loudspeaker
2 Carrier substrate
3 Actuator structure
4 Membrane
5 Coupling element
6 Substrate cavity
7 First substrate opening
8 Second substrate opening
9 Actuator layer
10 Support layer
11 Projection
12 Reinforcing element
13 Intermediate cavity
14 First connecting area
15 Second connecting area
16 Circuit board
17 First circuit board cavity
18 First hollow region
19 Cavity
20 Second hollow region
21 Sound-conducting channel
22 Third hollow region
23 Fourth hollow region
24 Sound outlet opening
25 Second circuit board cavity
26 ASIC
27 Passive electronic component
28 Side wall
29 First part
30 Second part
31 Stiffening element
32 Front surface

The invention claimed is:

1. MEMS loudspeaker for generating sound waves in the audible wavelength spectrum, comprising:
a carrier substrate defining a substrate cavity with two substrate openings, which are formed on two opposite sides of the carrier substrate;
a membrane having an edge area;
an actuator structure arranged in an area of one of the two substrate openings and connected to the carrier substrate in an edge area of the carrier substrate and spaced apart from the membrane to form an intermediate cavity between the membrane and the actuator structure, which is configured to generate vibrations in the membrane for generating sound waves, wherein the membrane traverses the one of the substrate openings and is connected to the carrier substrate in an edge area of the carrier substrate at a surface of the carrier substrate turned away from the actuator structure;
a coupling element arranged in the intermediate cavity and connecting the actuator structure to the membrane wherein the coupling element, the membrane and the actuator structure are free to vibrate with respect to the carrier substrate; and
a circuit board, which defines a first circuit board cavity, in which the carrier substrate, the actuator structure and the membrane are arranged in such a manner that the actuator structure and the membrane are able to vibrate;

wherein the first circuit board cavity defines a first hollow region, which at least partially includes the substrate cavity of the carrier substrate, wherein the first circuit board cavity defines a second hollow region, which is adjacent to the first hollow region, whereas the second hollow region is formed to be wider than the first hollow region, such that the carrier substrate is held in a positive-locking manner.

2. MEMS loudspeaker for generating sound waves in the audible wavelength spectrum, comprising:
a carrier substrate defining a substrate cavity with two substrate openings, which are formed on two opposite sides of the carrier substrate;
a membrane having an edge area;
an actuator structure arranged in an area of one of the two substrate openings and connected to the carrier substrate in an edge area of the carrier substrate and spaced apart from the membrane to form an intermediate cavity between the membrane and the actuator structure, which is configured to generate vibrations in the membrane for generating sound waves, wherein, when the actuator structure is active, the membrane can be deflected from a neutral position with an elongation of more than 200%, and wherein the actuator structure is formed in such a manner that, when the actuator structure is inactive, the membrane, after its deflection, can be led back into the neutral position by means of the actuator structure;
a coupling element arranged in the intermediate cavity and connecting the actuator structure to the membrane wherein the coupling element, the membrane and the actuator structure are free to vibrate with respect to the carrier substrate; and
a circuit board, which defines a first circuit board cavity, in which the carrier substrate, the actuator structure and the membrane are arranged in such a manner that the actuator structure and the membrane are able to vibrate;
wherein the first circuit board cavity defines a first hollow region, which at least partially includes the substrate cavity of the carrier substrate, wherein the first circuit board cavity defines a second hollow region, which is adjacent to the first hollow region, whereas the second hollow region is formed to be wider than the first hollow region, such that the carrier substrate is held in a positive-locking manner.

3. MEMS loudspeaker according to claim 1, wherein, when the actuator structure is active, the membrane can be deflected from a neutral position with an elongation of more than 200%, and wherein the actuator structure is formed in such a manner that, when the actuator structure is inactive, the actuator structure maintains the membrane stable in the neutral position.

4. MEMS loudspeaker according to claim 1, wherein the membrane has a thickness of less than 0.3 mm and an elastic modulus of less than 100 MPa.

5. MEMS loudspeaker according to claim 1, wherein the membrane includes a thickened reinforcing area.

6. MEMS loudspeaker according to claim 1, wherein the membrane includes a reinforcing element, which is arranged on its side turned away from the coupling element.

7. MEMS loudspeaker according to claim 1, wherein the actuator structure and the membrane are aligned parallel to each other in the neutral position, and the maximum height of the coupling element corresponds to the shortest spacing between the actuator structure and the membrane in the neutral position.

8. MEMS loudspeaker according to claim 1, wherein the first circuit board cavity features a third hollow region, which is adjacent to the second hollow region, in which the membrane is arranged in its end turned away from its second hollow region, whereas, the first circuit board cavity is formed to be wider in its third hollow region than in its second hollow region.

9. MEMS loudspeaker according to claim 1, wherein, in a cross-sectional view of the MEMS loudspeaker, the membrane is formed to be wider than the actuator structure and wider than the carrier substrate.

10. MEMS loudspeaker according to claim 1, wherein the intermediate cavity is formed by the substrate cavity and at least partially by the second hollow region and the third hollow region of the first circuit board cavity.

11. MEMS loudspeaker according to claim 1, wherein the coupling element is formed in one piece from silicon.

12. MEMS loudspeaker according to claim 1, wherein the coupling element is formed in multiple pieces, whereas the coupling element includes at least one first part connected to the actuator structure and a second part connected to the membrane, the second part being composed of at least one material selected from one of the materials listed in the group consisting of: silicon, ceramic, aluminum, aluminum nitride, plastic and a composite material.

13. MEMS loudspeaker according to claim 1, wherein the coupling element is connected to the actuator structure in a first connecting area and to the membrane in a second connecting area opposite to the first connecting area, and the second connecting area is formed in a manner larger, in the sense of wider in a cross-sectional view of the MEMS loudspeaker.

14. MEMS loudspeaker according to claim 1, wherein, at its end turned towards the membrane, the coupling element is formed in a manner wider than at its end turned towards the actuator structure, whereas the coupling element has a T-shape.

15. MEMS loudspeaker according to claim 1, wherein the coupling element is fastened to a side of the actuator structure turned towards the substrate cavity and the coupling element is formed to be higher compared to the carrier substrate.

16. MEMS loudspeaker according to claim 1, wherein the carrier substrate and the coupling element are produced from the same substrate blank of silicon, and the height of the carrier substrate is less than the height of the coupling element.

17. MEMS loudspeaker for generating sound waves in the audible wavelength spectrum, comprising:
a carrier substrate defining a substrate cavity with a first substrate opening formed on a first side of the carrier substrate and a second substrate opening formed on a second side of the carrier substrate opposite the first side of the carrier substrate;
a membrane having an edge area;
an actuator structure arranged in an area of one of the two substrate openings and connected to the carrier substrate in an edge area of the carrier substrate and spaced apart from the membrane to form an intermediate cavity between the membrane and the actuator structure, which is configured to generate vibrations in the membrane for generating sound waves;
a coupling element arranged in the intermediate cavity and connecting the actuator structure to the membrane wherein the coupling element, the membrane and the actuator structure are free to vibrate with respect to the carrier substrate; and a circuit board, which defines a first circuit board cavity, in which the carrier substrate, the actuator structure and the membrane are arranged in such a manner that the actuator structure and the membrane are able to vibrate;

wherein the first circuit board cavity defines a first hollow region, which at least partially includes the substrate cavity of the carrier substrate, wherein the first circuit board cavity defines a second hollow region, which is adjacent to the first hollow region, whereas the second hollow region is formed to be wider than the first hollow region, such that the carrier substrate is held in a positive-locking manner; and wherein the membrane is spaced at a distance from the carrier substrate and is connected in its edge area to the circuit board, whereas the membrane extends at least over the entire width of the first circuit board cavity.

* * * * *

UNITED STATES PATENT AND TRADEMARK OFFICE
CERTIFICATE OF CORRECTION

| | |
|---|---|
| PATENT NO. | : 9,980,051 B2 |
| APPLICATION NO. | : 15/311127 |
| DATED | : May 22, 2018 |
| INVENTOR(S) | : Andrea Rusconi Clerici Beltrami et al. |

It is certified that error appears in the above-identified patent and that said Letters Patent is hereby corrected as shown below:

On the Title Page

Item (72):
"Andrea Rusconi Clerici, Hamburg (DE)."
Should read:
--Andrea Rusconi Clerici Beltrami, Wien, (AT).--

Signed and Sealed this
First Day of October, 2019

Andrei Iancu
*Director of the United States Patent and Trademark Office*